United States Patent [19]

D'Amato

[11] Patent Number: 4,895,099

[45] Date of Patent: Jan. 23, 1990

[54] DEVICE FOR SEQUENTIAL SPRAY APPLICATION OF CHEMICAL SOLUTIONS USED IN THE PREPARATION OF CIRCUIT BOARD INNER LAYERS

[75] Inventor: Mark D'Amato, Montreal, Canada

[73] Assignee: D.E.M. Controls of Canada, Montreal, Canada

[21] Appl. No.: 267,044

[22] Filed: Nov. 3, 1988

[51] Int. Cl.⁴ ............................................. B05C 11/00
[52] U.S. Cl. ...................................... 118/58; 118/73; 118/110; 118/126; 118/314; 156/345
[58] Field of Search ................. 118/58, 73, 110, 126, 118/314, 324; 156/345; 427/96, 307, 421

[56] References Cited

U.S. PATENT DOCUMENTS

| | | | |
|---|---|---|---|
| 778,613 | 12/1904 | Ward | 414/529 |
| 895,621 | 8/1908 | Fawell | 198/791 |
| 1,040,504 | 2/1910 | Sexton | 49/30 |
| 2,031,054 | 2/1936 | McCarthy | 198/204 |
| 2,135,838 | 11/1938 | Paxton | 198/127 |
| 2,249,521 | 7/1941 | Graham et al. | 118/58 |
| 2,718,296 | 9/1955 | Johnson | 198/264 |
| 2,748,919 | 6/1956 | Britton et al. | 198/127 |
| 2,921,670 | 1/1960 | Albers | 198/213 |
| 3,042,185 | 7/1962 | Welch, III | 198/160 |
| 3,082,774 | 3/1963 | Benton et al. | 134/63 |
| 3,313,199 | 4/1967 | Houvener et al. | 85/66 |
| 3,416,638 | 12/1768 | Buck | 193/37 |
| 3,440,900 | 4/1969 | Neal | 37/6 |
| 3,457,234 | 7/1969 | Gianatasio | 260/75 |
| 3,667,589 | 6/1972 | Constable | 198/127 |
| 3,967,632 | 7/1976 | Herrmann et al. | 156/345 |
| 4,015,706 | 4/1977 | Goffredo et al. | 198/780 |
| 4,017,343 | 4/1977 | Haas | 156/345 |
| 4,600,601 | 7/1986 | Tamura | 427/421 |
| 4,627,698 | 12/1986 | Yamasaki et al. | 118/110 |
| 4,722,349 | 9/1988 | Cooper | 156/345 |
| 4,741,798 | 9/1988 | Haas | 156/345 |

FOREIGN PATENT DOCUMENTS 1280994 11/1961 France .

OTHER PUBLICATIONS

General Processing Guide for TINBOND TM 600, E.I. duPont de Nemours Corp., Wilmington, Delaware.

Primary Examiner—Bernard Nozick
Attorney, Agent, or Firm—Stetina and Brunda

[57] ABSTRACT

Disclosed is a device for continuously and sequentially applying Durabond TM treatment chemicals or any similar chemical system used in the manufacture of multilayer printed circuit boards. The device of the invention generally comprises a mechanized conveyor line having spray manifolds positioned above and below the line at various points so as to effect the desired sequential spraying of the treatment chemicals and rinse solution. Chemical containment sumps or tanks are specifically sized so as to provide coordinate solution volumes, thereby minimizing the need for intermittent shut down of the line to replenish individual solutions. The provision of such coordinated solution volumes also prevents chemical waste. A multistage water rinse is employed at one point in the inventive process to insure that all excess immersion tin solution is thoroughly rinsed from the surfaces of the circuit board layers. Such multistage rinse includes at least one high pressure water rinse in excess of 100 psi. A plurality of specialized rollers are employed to level and/or evenly disperse post treatment solution over the surfaces of the circuit board inner layers. Such specialized rollers preferably comprise a metal core having a chamois-like silicon free natural fiber covering disposed thereupon.

21 Claims, 5 Drawing Sheets

DEVICE FOR SEQUENTIAL SPRAY APPLICATION OF CHEMICAL SOLUTIONS USED IN THE PREPARATION OF CIRCUIT BOARD INNER LAYERS

This application pertains generally to the art of chemical processing and more particularly to a method and device for the continuous, sequential spray application of chemical treatment solutions used in the manufacture of multilayer printed circuit boards.

In the manufacture of multilayer printed circuit boards it is common practice to laminate numerous "inner layers" to form a desired multilayer circuit board structure. Each individual inner layer consists generally of a quantity of epoxy impregnated woven glass material sandwiched between two copper foils.

Before the inner layers are bonded together to form the desired multilayer structure, a series of electronic "traces" are photographically formed on the outer surfaces of the copper foils. After the desired electronic traces have been formed, the surfaces of the copper foils are subjected to certain preparatory processes for the purpose of enhancing the subsequent adhesion of epoxy bonding agents thereto, without disturbing the previously formed electronic traces.

Until recently, preparation of the copper surfaces for subsequent bonding and lamination generally involved either (a) simple abrasion or (b) chemical oxidation. Such (a) abrasion or (b) oxidation of the inner layers resulted in nothing more than physical roughening of the copper surfaces. Such physical roughening of the surfaces was thought to mechanically enhance or promote bonding of the epoxy adhesives thereto. However, such prior art methods are associated with bond failure and various surface defects, including that known in the art as "pink ring". "Pink ring" occurs when certain oxidizing chemicals are applied unevenly or improperly, resulting in the formation of a ring-like defect in the surface of the inner layer.

Recent advances in the art have provided an improved method of preparing the copper surfaces of circuit board inner layers for subsequent epoxy bonding. Such improved method, marketed commercially as the DuraBond TM Multilayer Bonder System (E.I. du-Pont de Nemours Corp., Wilmington, Delaware) utilizes serial chemical treatments of the copper surfaces to promote chemical rather than mechanical bonding of the epoxy adhesive to each inner layer. Such chemical bonding is thought to be superior to the prior art mechanical bonding.

Specifically, the above-described improved method for preparing circuit board inner layers utilize four (4) separate chemical treatments, performed sequentially on the exposed copper surfaces of each circuit board inner layer. The four separate chemical compositions utilized in these sequential treatments are (1) an alkaline cleaner, (2) an etching solution, (3) an aqueous tin salt solution and (4) a post treatment solution.

In accordance with the DuraBond TM process, each inner layer is initially cleaned by the alkaline cleaning solution (VersaClean TM 415—alkaline cleaner). After the cleaning solution has been applied, the inner layer is thoroughly rinsed.

Next, a potassium peroxymonosulfate solution (SureEtch TM 600S—etching solution) is applied to chemically etch the surfaces of the copper foils. The application of such etching solution causes less than 10 mil of copper metal to be etched away from the copper foil surface(s) of each inner layer. Thereafter, the inner layer is again rinsed with water.

After rinsing, an aqueous tin salt solution known in the art as "immersion tin" is applied. Such "immersion tin" solution contains tin salts capable of undergoing a galvanic plating reaction upon the previously etched surface of the copper foil. The presently preferred immersion tin solution of the DuraBond TM process comprises a mixture of stannous salts, stabilizers, thiourea and proprietary leveling agents in 10% sulfuric acid. (DuraBond TM 600A/B—Immersion Tin Solution).

After the immersion tin solution has been applied and the desired galvanic plating reaction has occurred, the inner layer is once again rinsed with water. A layer of tin remains plated on the etched copper surfaces. Thereafter, a post treatment solution containing a silane coupling agent (DuraBond TM 600 PT—Post Treatment Solution) is applied. The silane coupling agent bonds to the tin atoms which have plated upon the etched copper surfaces.

Subsequently, the inner layers are subjected to heat so as to promote the formation of a bronze alloy between the plated tin atoms and the underlying copper substrate. The silane coupling agent remains bound to the tin atoms as they undergo assimilation into the bronze alloy. As such, the unbound or free ends of the silane molecules remain available to bind with subsequently applied chemical adhesives.

An epoxy adhesive capable of chemically bonding to the unbound portion(s) of the silane molecules is then applied and the inner layers are stacked in horizontal juxtaposition so as to form the desired multilayer structure. Because the epoxy adhesive is chemically bound to free sites on the tin-bound silane molecules, such adhesive will serve to firmly, chemically bind the individual inner layers, thereby fixing them in the desired multilayer configuration.

It is desirable that the above-described DuraBond TM chemicals be applied by continuous spray systems in an in-line, conveyorized processing operation. Of course, dip tank or immersion methodology may also accomplish the desired result, but spray application is preferred because spray processes are efficient, easily automated and are given to even application of the chemical solutions without running or streaking.

Although spray application is the preferred method of applying the chemical solutions of the DuraBond TM system, much of the standard commercially available sprayer equipment is less than adequate for such purposes because such standard equipment is not specifically sized or designed to carry out the desired sequential application of the four chemical solutions of the DuraBond TM system. Nor is such prior art equipment adapted to thoroughly rinse the various chemical solutions from the surfaces of the inner layers. Accordingly, the use of such prior art equipment may result in unnecessary waste of the DuraBond TM chemicals and certain processing problems.

One type of problem which may be encountered when spraying the immersion tin solution (DuraBond TM 600 A/B) is known to occur due to the formation of solid precipitant matter within the liquid solution. Such solid precipitant matter is generally believed to result from the complexing of copper atoms with the thiourea component of the immersion tin solution. The formation of such copper-thiourea complexes is difficult to avoid because, in the DuraBond TM process, the immersion tin solution continually accumulates copper as it gives up tin atoms. Generally, when the concentration of copper within the immersion tin solution exceeds a critical level, (i.e. 3,000 ppm) a copper-thiourea precipitate will form. The presence of such precipitate within the solution may, of course, cause some or all of the above-described processing problems.

Additionally, efforts to continuously spray apply the chemical treatment solutions of the DuraBond TM system using conventional prior art spray processing equipment may lead to unnecessary waste of chemicals of unnecessary down time due to uncoordinated solution volumes held within the device.

Furthermore, conventional circuit board processing equipment may fail to sufficiently rinse or otherwise remove any unreacted immersion tin solution from the surfaces of the inner layers. The presence of residual immersion tin solution on the inner layer surfaces may result in eventual shortening and decreased field life of the circuit boards because such immersion tin solution contains electrically conductive tin salts. Electrical shorts of such origin are difficult to diagnose and virtually impossible to repair after the inner layers have been laminated and assembled into multilayer boards.

In view of the above-described shortcomings of the prior art, there exists a present need for a method and device capable of efficiently and reproducably applying the DuraBond TM chemicals by spray methodology.

It is desirable that any process for applying the DuraBond TM chemicals be capable of increasing or optimizing the overall productivity of the manufacturing operation in which it is used. Also, it is desirable that such process be capable of minimizing the formation and/or effects of solid precipitant matter which may form within any or all of the DuraBond TM treatment solutions. In addition, it is desirable that any process for applying the DuraBond TM chemicals be operative to fully and completely remove unreacted tin solution and/or precipitant matters from the surfaces of the circuit board inner layers so as to prevent subsequent electrical shorting of the finally assembled circuit board due to the presence of electrically conductive materials on the inner layer surfaces.

SUMMARY OF THE INVENTION

In accordance with the invention there is provided a method and device for continuously and sequentially applying the DuraBond TM treatment chemicals or any similar chemical system. The invention comprises a method and device for generally carrying out the steps of:

(a) spraying a cleaner solution (e.g. alkaline cleaner) onto the copper surfaces of the inner layers;

(b) rinsing the cleaner solution from the copper surfaces of the inner layers;

(c) spraying an etching solution onto the copper surfaces of the inner layers;

(d) rinsing the etching solution from the copper surfaces of the inner layers;

(e) spraying an immersion tin or other galvanic plating solution onto previously etched copper surfaces of the inner layers;

(f) thoroughly rinsing the excess immersion tin or other solution from the inner layers by way of a multistage rinse which includes at least one high pressure (e.g. more than 100 psi) spray rinse;

(g) spraying a post-treatment solution containing a silane coupling agent or other material capable of binding to the previously plated tin or other atoms on the etched copper surfaces;

(h) leveling the post-treatment solution on the surfaces of the inner layers and/or removing any excess post-treatment solution therefrom; and (i) exposing the inner layers to heat or some other means of curing and/or completing the silane-tin reaction.

Further in accordance with the invention, the temperatures of the individual solutions may be controlled to optimize processability and/or reactivity and to minimize the formation of precipitant matter therein. Also, to further protect against the effects of precipitant matter, the device of the present invention may include one or more screens and/or filters to continually remove precipitant or other solid matter from one or more of the treatment solutions as they are recirculated within the device.

Still further in accordance with the invention, one or more of the chemical treatment solutions may be spray applied through the use of spray nozzles comprising polypropylene outer bodies with ceramic alumina inserts positioned therein. Such polypropylene-ceramic alumina spray nozzles are operative to cause expulsion of the solution(s) in the desired spray pattern(s) while at the same time being sufficiently durable to withstand abrasion and friction as may be caused by particulate matter contained within the solution(s).

Even further in accordance with the invention the immersion tin solution (DuraBond TM 600 A/B) or other plating solution may be removed from the surfaces of the inner layers by way of a specific multistage rinse. Such multistage water rinse comprises the steps of:

(a) subjecting the inner layers to a first recirculated or fresh water spray;

(b) subjecting the inner layers to a high pressure rinse consisting of recirculated or fresh water sprayed at an approximate pressure of greater than approximately 100 psi and preferably around 200 psi;

(c) subjecting the inner layers to a second recirculated or fresh water spray; and (d) subjecting the inner layers to a final fresh water rinse consisting of a spray of unrecirculated fresh water at a pressure below 100 psi and preferably around 45 psi.

Such multistage rinse process is specifically designed to insure complete removal of unplated tin solution and/or other materials contaminating the surfaces of the inner layer. This multistage rinse process serves to prevent electrical shorting of the circuit boards as may occur when tin salts or other electrically conductive materials are allowed to remain on the surface of the inner layers.

Still further in accordance with the invention the conveyorized device by which the treatment chemicals and rinse solutions are applied may comprise a mechanical conveyor operative to move the inner layers along a fixed path at a fixed rate. Individual spray manifolds are specifically positioned near (e.g. above and below) the conveyor. The chemical treatment solution and/or rinse solution or water are sprayed from the manifolds onto the copper surfaces of the inner layers as they pass, at a fixed rate, along the conveyor path. The spray patterns emitted by each of the manifolds will be specifically sized and directed so that each inner layer will be exposed to each treatment solution or rinse spray for a prescribed period of time. (e.g. A conveyor traveling at four (4) ft/min passing through a chemical spray region 12 inches in length will serve to expose each individual inner layer to such spray for a period of 15 seconds.)

Even further in accordance with the invention, the sumps, bins, tanks or other containers for holding the various chemical treatment solutions will be specifically sized so as to provide coordinated volumes of chemical treatment solutions, thereby maximizing efficiency and minimizing chemical waste. Specifically, the sumps or other containers in which the chemical treatment solutions are pooled are correspondingly sized/configured to hold enough of each solution to run for a predetermined operation period, but at the same time to hold no more solution than may be fully exhausted or utilized during the desired period of operation. Ideally, the maximum on-board volume of each chemical treatment solution will be sufficient to enable the processing line to run without interruption for a predetermined period of hours time (e.g. 40 hours) but, will not be excessive, thereby ensuring that each solution will be fully exhausted or used at the end of the predetermined time period. The objective is to have each treatment solution become exhausted and ready for replacement at the same time (e.g. at the end of the desired operation period). Accordingly, if each sum is appropriately sized and/or configured in accordance with the invention, the sumps may be initially filled to their maximum levels. Thereafter, the treatment line may be operated for the entire operation period (e.g. 40 hours) without any need for replenishment/replacement of individual solutions. At the end of the operation period, however, all of the solutions will be in need of replenishment. Thus, specific sizing of the sumps promotes economy of material use by causing each treatment solution to be used to its fullest capacity without unnecessary down time or wasteful discard of unexhausted or unused solution.

Even further in accordance with the invention, one or more specialized rollers or other leveling apparatus may be employed to remove excess chemical treatment solution(s) from the circuit board inner layers and to level the remaining post-treatment solution layer, thereby ensuring that such layer of chemical treatment solution(s) is evenly distributed and of uniform thickness upon the surfaces of the inner layers.

Further objects and advantages of the invention will become apparent to those skilled in the art upon reading and understanding of the following detailed description of the preferred embodiments and the accompanying drawings.

DETAILED DESCRIPTION OF THE PREFERRED EMBODIMENT

The accompanying drawings are provided for the purposes of illustrating presently preferred embodiments of the invention and are not intended to limit the scope of the invention in any way.

i. A Preferred Process

The inventive method or process of the present invention involves a series of separate steps whereby each of the four chemical treatment solutions of the Dura-Bond TM system are sequentially spray applied to circuit board inner layers as they pass along a continuous conveyor.

Figure 1:
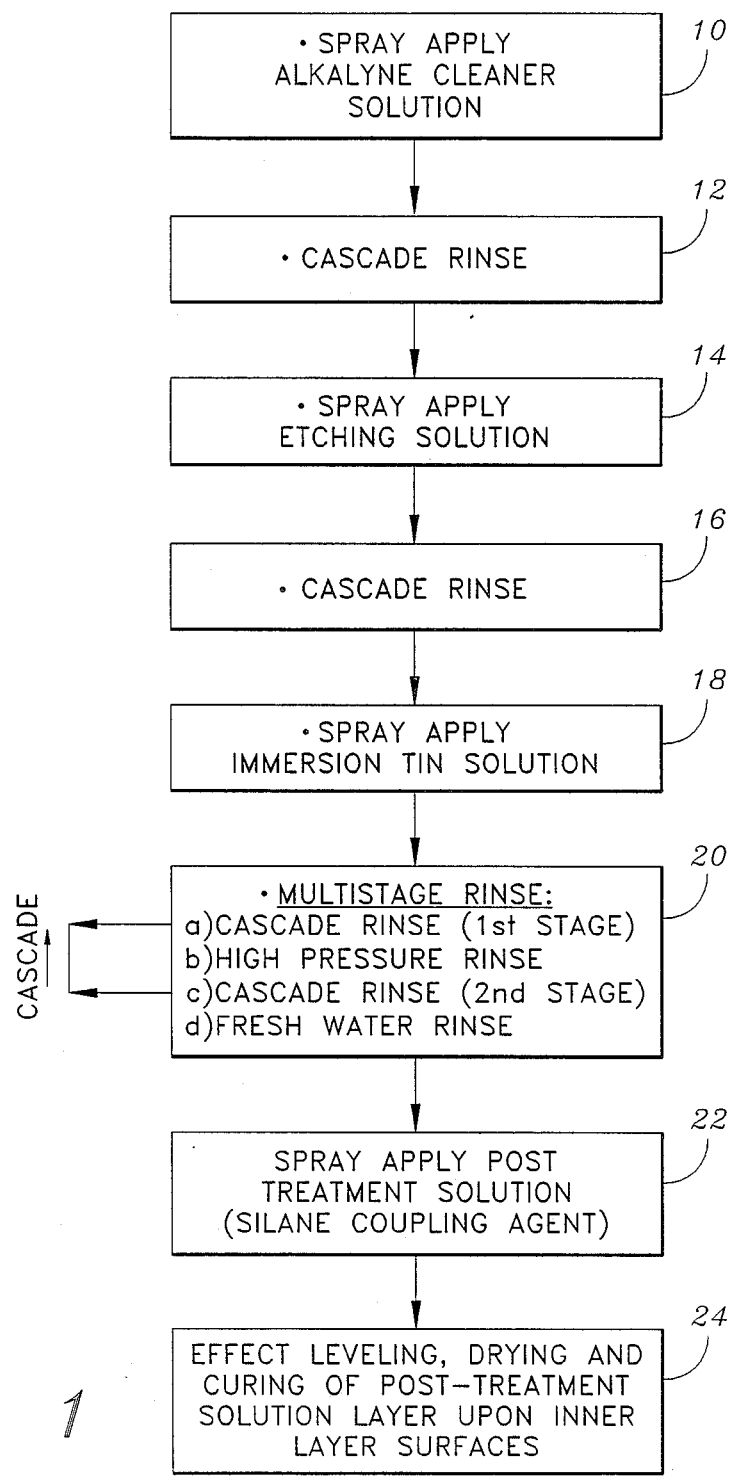
FIG. 1 is a block diagram showing a preferred process of the present invention.

Specifically, as illustrated in the block diagram of FIG. 1, the initial step of the inventive process comprises the spray application of alkaline cleaner solution 10 (e.g. Versaclean TM 415 E.I. DuPont de Nemours Corp., Wilmington, Delaware) to the inner layers. Preferably, each circuit board inner layer will be subjected to the alkaline spray for a period of approximately 30 seconds. Thereafter, the alkaline cleaner is rinsed from the exposed copper surfaces by way of a first cascade water rinse 12. The first cascade water rinse 12 comprises a recirculating water spray emanating from a plurality of spray nozzles or manifolds traversing above and/or below the conveyor. The water is sprayed at about 20–60 psi onto the individual inner layers as they pass along the conveyor.

After passing through the first cascade rinse 12, the circuit board inner layers are then subjected to the spray application of an etching solution 14. The etching solution (e.g. SureEtch TM 600 S) is sprayed from a plurality of spray nozzles or manifolds positioned above and/or the conveyor. The temperature of the etching solution is generally maintained at approximately 60 F and is preferably sprayed at pressures of 15 to 45 psi so as to deliver between 40 and 120 liters per minute of the solution. It is desirable that each circuit board inner layer be exposed to the etching solution for a full 60 seconds as advancement of the conveyor continues.

After the inner layers have been subjected to the etching solution they will then undergo a second cascade rinse 16, effected in essentially the same manner as the first cascade rinse 12, described above.

After the second cascade rinse 16 has been completed, the circuit board inner layers will then be subjected to the spray application of an immersion tin solution 18. Such immersion tin solution (e.g. Dura-Bond TM 600 A/B) is applied by a plurality of spray nozzles or manifolds directed at the inner layers as they advance along the fixed conveyor line. The immersion tin solution is maintained within a range of 70-80 F and preferably at a recommended operating temperature of approximately 72 F and is delivered at a pressure of approximately 25-30 pounds. It is desirable that the immersion tin solution spray be delivered at a rate of approximately 120 liters/min and that each inner layer be exposed to the immersion tin solution spray for at least 60 sec.

Following application of the immersion tin solution, the advancing circuit board inner layers are subjected to a multistage water rinse 20. Such multistage rinse is particularly important in that it is intended to ensure the removal of all non-plated tin and excess tin salts from the surface of the inner layers. Preferably, the multistage rinse 20 will comprise the sequential steps of passing the inner layers through: (a) a first-stage recirculated spray rinse at a pressure of approximately 25-30 psi for about 15 sec. (b) a second stage high pressure spray rinse (recirculated/nonrecirculated) at a pressure of approximately 100-250 psi for about 5-10 sec.; (c) a third stage recirculated spray rinse at a pressure of approximately 25-30 psi for about 15 sec.; and (d) fourth stage nonrecirculated water (e.g. "fresh water") rinse at standard line pressure approximately 40 psi) for about 5-10 seconds.

After the inner layers have been subjected to the multistage rinse process 20 they will be subjected to the spray application of a post-treatment solution 14. The post treatment solution contains a silane coupling agent (e.g. DuraBond TM 600 PT) capable of chemically bonding to the previously plated tin atoms. Such post-treatment solution is preferably applied through a series of spray nozzles or manifolds located above and/or below the conveyor. The post-treatment solution is sprayed at pressures of approximately 25 psi. In this preferred embodiment it is desirable that the post-treatment solution be delivered at a rate of 50 liters per minute; and that each inner layer be exposed to the post-treatment solution spray for at least approximately 15 seconds.

Following spray application of the post-treatment solution 14, the inner layers move along the conveyor to a final location or locations where leveling (e.g. removal of excess, post treatment solution and distributing the remaining solution in a even and uniform layer upon the surfaces of the inner layers), drying and curing (e.g. promoting reaction of the silane coupling agent with the tin atoms) is effected. (24)

In accordance with this presently preferred process, the available amounts of chemical solutions may be specifically coordinated to permit the process to run continuously for approximately 40 hours without interruption and/or the addition/exchange of chemical solutions. For example, the following solution volumes are provided at the beginning of the 40 hour operational period:

| | |
|---|---|
| .alkaline cleaner (Versaclean TM 415) | approximately 55 gal. (preferably one (1) sump of about 55 gal.) |
| .etching solution (SureEtch TM 600S) | approximately 160-220 gal. (preferably two (2) sumps of about 80 gal. each) |
| .immersion tin (DuraBond TM 600 A/B)) | approximately 180-220 gal. (preferably two (2) sumps of about 95 gal. each) |
| .post treatment solution (DuraBond TM 600 PT) | approximately 60-80 gal. (preferably one (1) sump of about 70 gal.) | ii. A Preferred Device

As shown in FIGS. 2a–d and 3a–d, the presently preferred device of the invention comprises a generally horizontal mechanical conveyor 50 running directly through three longitudinally arranged major enclosures or housings 52, 54, 56. The first major housing 52 is joined in an end-to-end fashion with the second major housing 54 by way of transitional enclosure 58. Likewise, the second major housing 54 is joined in and end-to-end fashion with the third major housing 56 by way of transitional enclosure 60. Thus, all chemical sprays, vapors, etc. emitted by the process are fully contained in generally air tight enclosures. Such containment of the sprays and vapors is highly desirable in view of the known toxicity of certain commonly used treatment chemicals.

Initially, the circuit board inner layers are positioned at the input end 62 of conveyor 50. As the inner layers advance along conveyor 50 they will enter the first major housing 52. After entering the first major housing 52 the inner layers will pass between spray manifold 64 and 66. Generally, each of the spray manifolds incorporated into the preferred device comprise at least two longitudinal pipes with a series of individual pipe segments traversing therebetween. Such individual pipe segments will run transversely above and below the conveyor 50. A series of individual spray nozzles or openings are provided such that pressurization of the solution within the manifold will cause a solution to be dispersed, in a generally even spray pattern, onto the surfaces of the inner layers as they pass along the conveyor 50.

The first pair of spray manifolds 64, 66 are fluidly connected to an alkaline cleaner sump 68. The alkaline cleaner sump 68 is specifically sized and/or configured to hold approximately 55 gallons of alkaline cleaner solution (VersaClean TM 415) when fully filled. A pump 65 is used to pump the alkaline cleaner solution from sump 68 to spray manifolds 64 and 66. The alkaline cleaner solution is then continuously sprayed at about 25 psi from manifolds 64 and 66. The alkaline cleaner spray covers a region approximately 24 inches in length. Thus, as the inner layers pass along the conveyor at a rate of 4 ft/min they will be exposed to the alkaline cleaner solution spray for about 30 seconds each. Runoff or excess alkaline cleaner solution is recollected in sump 68 so as to be continuously recirculated within the system.

After the advancing inner layers have passed through the alkaline cleaner spray they will pass through openings in partitions 70 and 72, thus emerging into a first cascade rinse spray emanating from spray manifolds 74, 76, 80 and 82. Specifically, spray manifolds 74 and 76 are connected to a first water feed line 78 while spray manifolds 80 and 82 are connected to a second water feed line 84. First water feed line 78 is connected to sump 86 while the second water feed line 84 is connected to sump 88. A pump 89 is employed to circulate water from sump 88 through feedline 84 to pressurize manifolds 80 and 82. The water sprayed from manifolds 80 and 82 strike the underlayers and/or conveyor. The subsequent runoff is then recollected in sump 88. Sump 88 is fluidly connected to neighboring sump 86. Excess reclaimed water in sump 88 is permitted to "cascade" into sump 86. Hence the term "cascade rinse".

Similarly, a centrifugal pump 87 circulates water from sump 86 through water feedline 78 to pressurize manifold 74 and 76. The resultant spray from manifolds 74 and 76 strikes the advancing inner layers and/or conveyor surfaces and is subsequently recollected in sump 86. The reclaimed water in sump 86 is then continually recirculated and sprayed from manifolds 74 and 76. Excess water in sump 86 escapes to drain through an overflow.

The sprays emanating from manifolds 74, 76, 80, 82 cover a combined region of approximately 16-20 inches at pressures of about 20-60 psi and preferably at 26-27 psi. The inner layers passing along the conveyor at the rate of approximately 4 ft/min will be exposed to this first rinse spray for a total of about 20-30 seconds.

After the advancing inner layers have passed through the first cascade rinse, they will pass through openings in partitions 90 and 92, thus moving into an etching solution spray (SureEtch TM 600 S) which emanates from spray manifolds 94 and 96.

Spray manifolds 94 and 96 are fluidly connected to sump 98. Sump 98 is specifically sized and configured to contain about 80-110 gallons and preferably 80 gallons of etching solution when fully filled. Thus a total of approximately 160-220 gallons and preferably 160 gallons of etching solution is provided with the sumps 98 and 104 are filled to capacity. The etching solution is circulated from sump 98 to manifolds 94 and 96 by way of a centrifugal pump 95. Thus, the inner layers are exposed to the etching solution spray emanating from manifolds 94 and 96 as they advance along conveyor 50. Runoff etching solution from spray manifolds 94 and 96 is recollected in sump 98 and recirculated. This etching solution spray process is then repeated by spray manifold 100 and 102 which are fluidly connected to sump 104. Sump 104 is also sized and configured to contain 110 gallons of etching solution when fully filled and is fluidly connected to manifolds 100 and 102 so that solution pumped by centrifugal pump 101 from sump 104 will be sprayed from manifolds 100 and 102 onto the advancing inner layers as they move along conveyor 50. The runoff etching solution from manifolds 100 and 102 will then be recollected in sump 104 and subsequently recirculated.

Filters 103 and 105 are provided and are appropriately sized to remove any solid matter from the etching solution as it is recirculated and sprayed. All filters incorporated with the device of the present invention will be appropriately sized to remove potentially deleterious solid matter from the recirculation chemical solution (s).

An inner partition 106 separates manifolds 94, 96 from manifolds 100, 102. Thus, the etching solution spray treatment is divided between two (2) separate inner chambers. Manifolds 94, 96, 100 and 102 are each sized to provide a spray pattern approximately 48 inches in length. Thus, as the inner layers advance along conveyor 50 at a rate of 4 ft/min they will be exposed to etching solution for a total of 1 minute, (two (2) 30 second exposures).

Following exposure to the etching solution the inner layers will continue to advance along conveyor 50, through openings in partitions 108, 110 and 116 and into the second major housing 54. As they move into the second major housing 54 they will pass through a second cascade rinse emanating from manifolds 118, 120, 122 and 124. Manifolds 122 and 124 are fluidly connected to a tapwater feedline 126 which will provide pressurized water through spray manifolds 122 and 124. After spraying, the runoff water is then recollected in sump 128.

Sump 128 is fluidly attached to sump 126 such that excess water collected in sump 128 will cascade into sump 126. Sump 126 is fluidly connected to manifolds 118 and 120 via water supply line 130. Water is pumped by centrifugal pump 127 from sump 126 through supply line 130 and into manifolds 118 and 120 where it is subsequently sprayed upon the advancing inner layers. Excess water in sump 126 is permitted to overflow into a drain.

The water sprays emanating from manifolds 118, 120, 122 and 124 are at pressures of about 20-60 psi and preferably at 26-27 psi.

After emerging from the second cascade rinse, the inner layers will pass through openings in partitions 140 and 142 and into an immersion tin solution spray which emanates from manifolds 144, 146, 148 and 150. Manifolds 144 and 146 are connected to sump 152 while manifolds 148 and 150 are connected to a separate sump (not shown). Accordingly, the immersion tin solution is held and collected in two separate sumps and sprayed through two separate sets of manifolds. Each of these sumps 152 and (not shown) is specifically sized and configured to contain approximately 90-110 gallons and preferably about 95 gallons of immersion tin solution (DuraBond TM 600 A/B) when fully filled. Thus, a total volume of approximately 180-220 gallons and preferably about 190 gallons of the immersion tin solution is available when both sumps 152 and (not shown) are filled to capacity. Immersion tin solution held in sump 152 is pumped through manifolds 144 and 146 by centifugal pump 145. An in-line filter 147 is provided. Similarly, immersion tin solution contained in the second sump (not shown) is pumped through manifolds 148 and 150 by centrifugal pump 149. Filter 151 is also provided.

An inner partition 154 separates the spray created by manifolds 144 and 146 from the spray created by manifolds 148 and 150, thereby dividing the immersion tin solution sprays into two separate chambers. The spray patterns created by manifolds 144, 146, 148 and 150 are specifically sized to expose a total of approximately 48 inches of the advancing conveyor to the immersion tin solution spray. Thus, as the inner layers advance along the conveyor at a fixed rate of 4 ft/min they will be exposed to the immersion tin solution spray for a total of 1 minute (two 30 second exposures).

Following exposure to the immersion tin solution spray, the inner layers will pass through openings in partitions 156, 158 and 159, thus moving into the third major housing of the overall device. Upon entering the third major housing 56, the advancing inner layers will be exposed to a novel and highly effective multi-stage rinse.

The preferred multi-stage rinse of the present invention consists of a four stage water rinse comprising (a) a first water spray emanating from manifolds 160 and 162; (b) a second (high pressure) water spray emanating from manifolds 166 and 168; (c) a third water spray emanating from manifolds 172 and 174; and (d) a fourth (fresh) water spray emanating from manifolds 178 and 180.

Figure 2A:
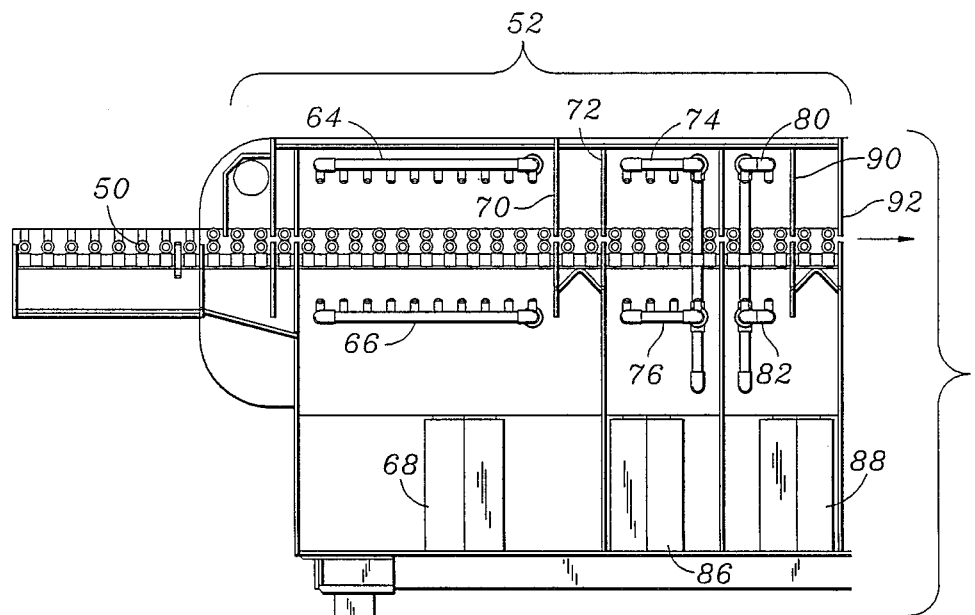
FIG. 2a is a first portion of an elevational view of a preferred conveyorized processing line in accordance with the present invention.
Figure 2B:
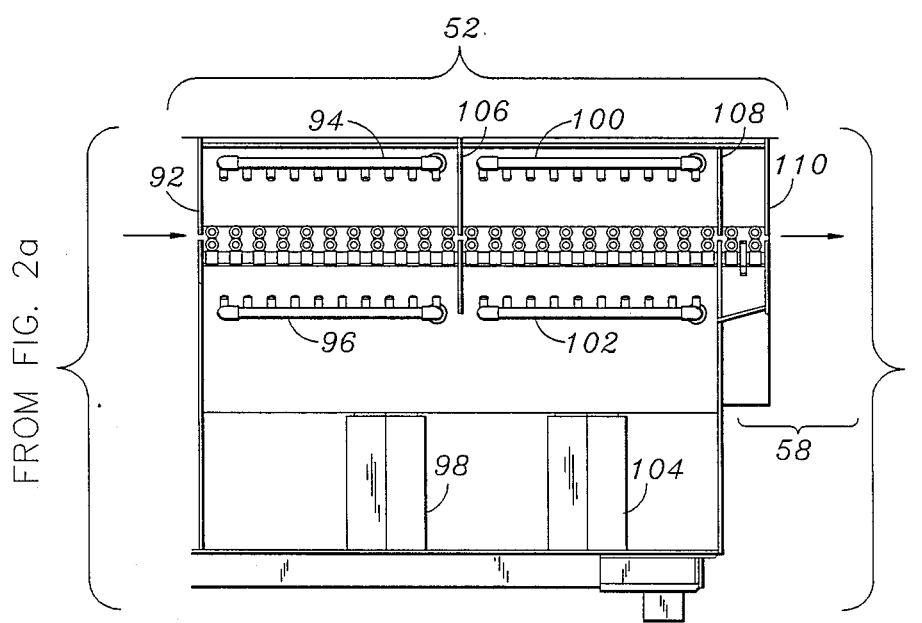
FIG. 2b is a second portion of an elevational view of a preferred conveyorized processing line in accordance with the present invention.
Figure 2C:
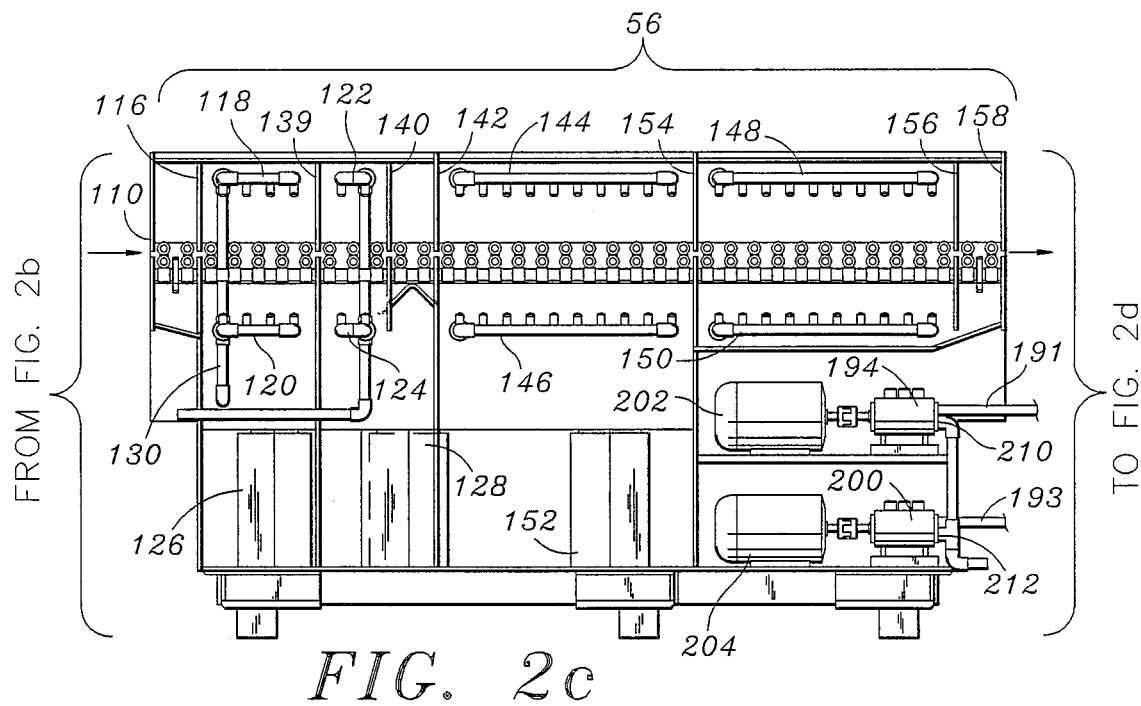
FIG. 2c is a third portion of an elevational view of a preferred conveyorized processing line in accordance with the present invention.
Figure 2D:
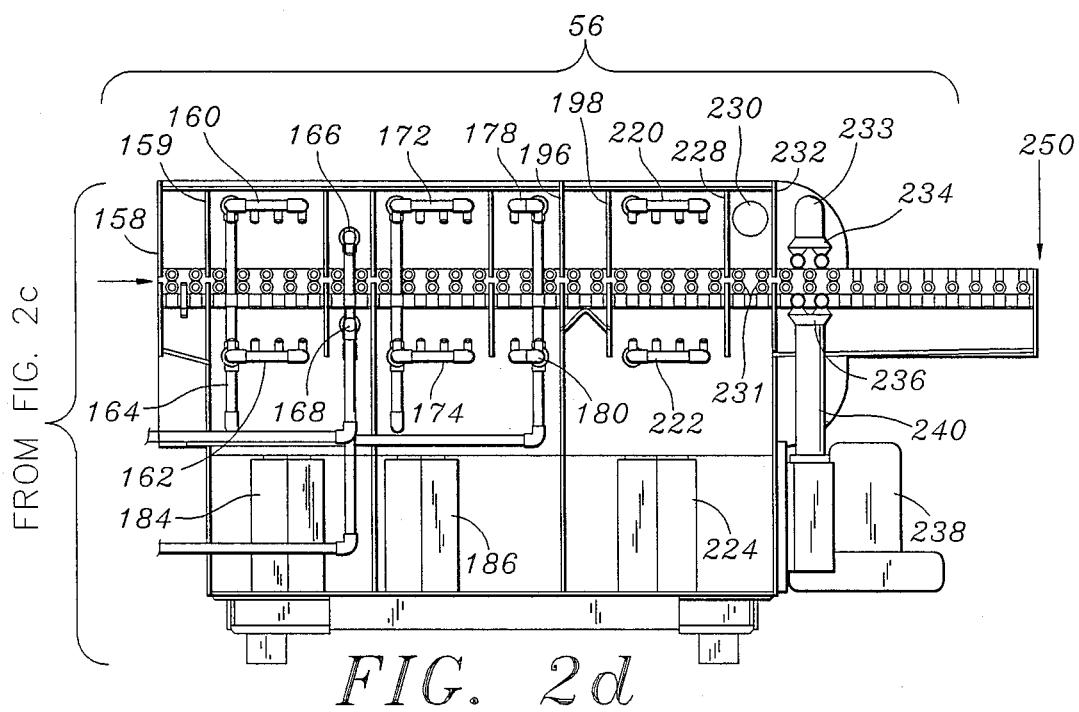
FIG. 2d is a fourth portion of an elevational view of a preferred conveyorized processing line in accordance with the present invention.
Figure 3A:
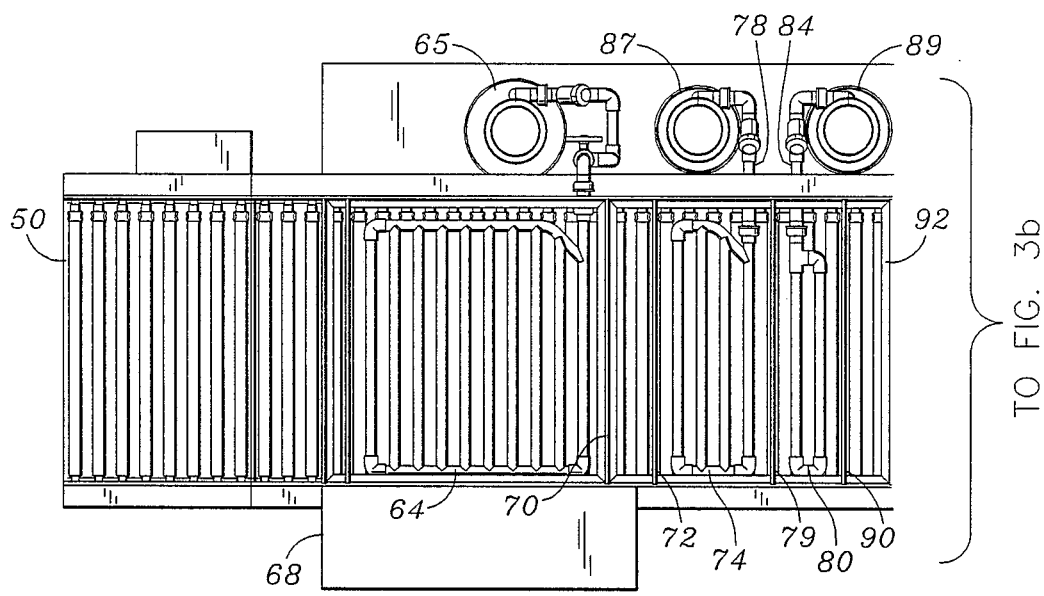
FIG. 3a is a portion of a top view of a preferred conveyorized processing line in accordance with the present invention, wherein the top covers of various enclosures have been removed so as to expose the interior elements thereof.
Figure 3B:
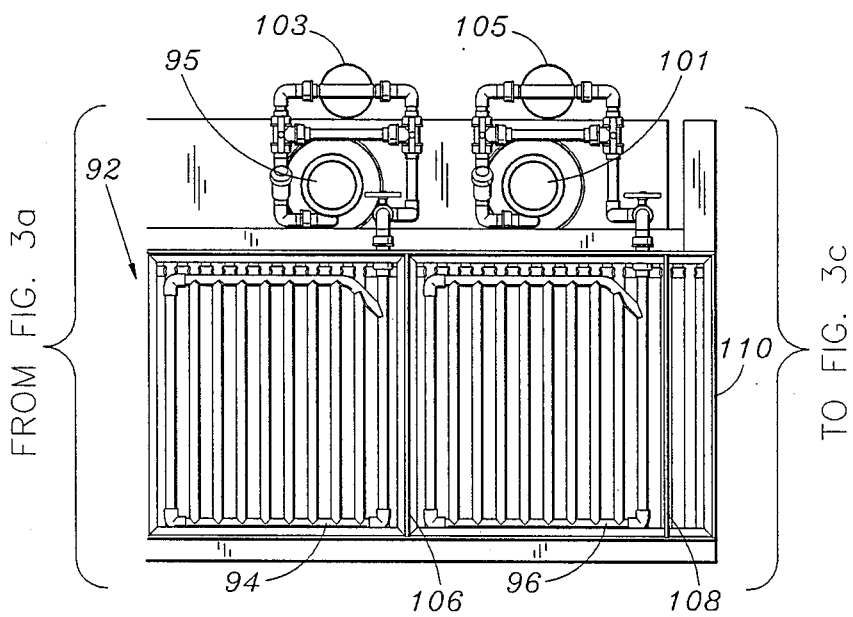
FIG. 3b is a second portion of a top view of a preferred conveyorized processing line in accordance with the present invention, wherein the top covers of various enclosures have been removed so as to expose the interior elements thereof.
Figure 3C:
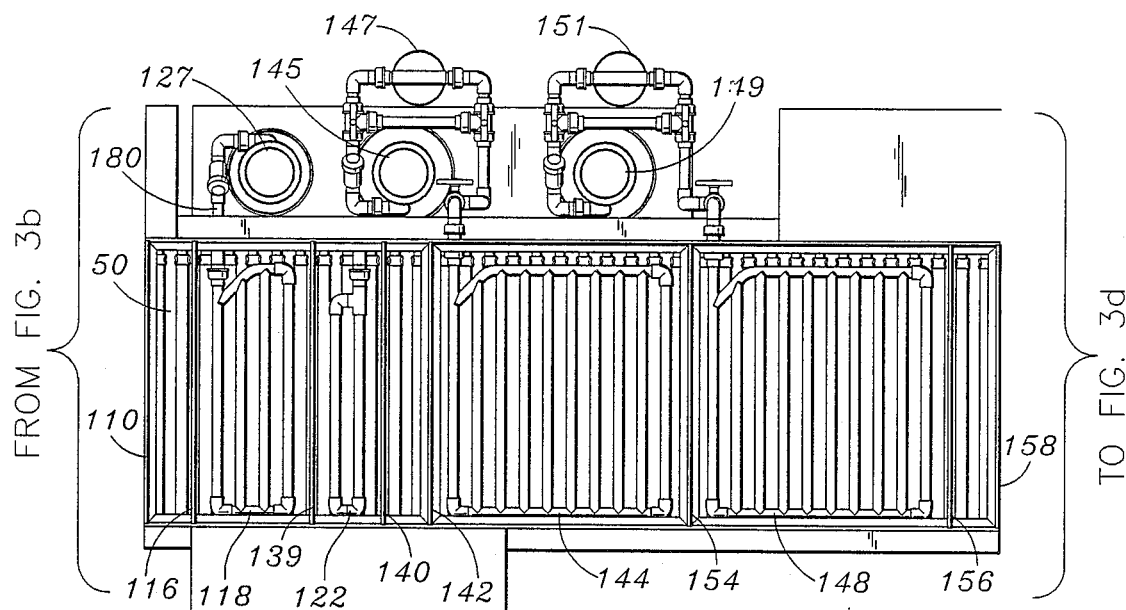
FIG. 3c is a third portion of a top view of a preferred conveyorized processing line in accordance with the present invention, wherein the top covers of various enclosures have been removed so as to expose the interior elements thereof.
Figure 3D:
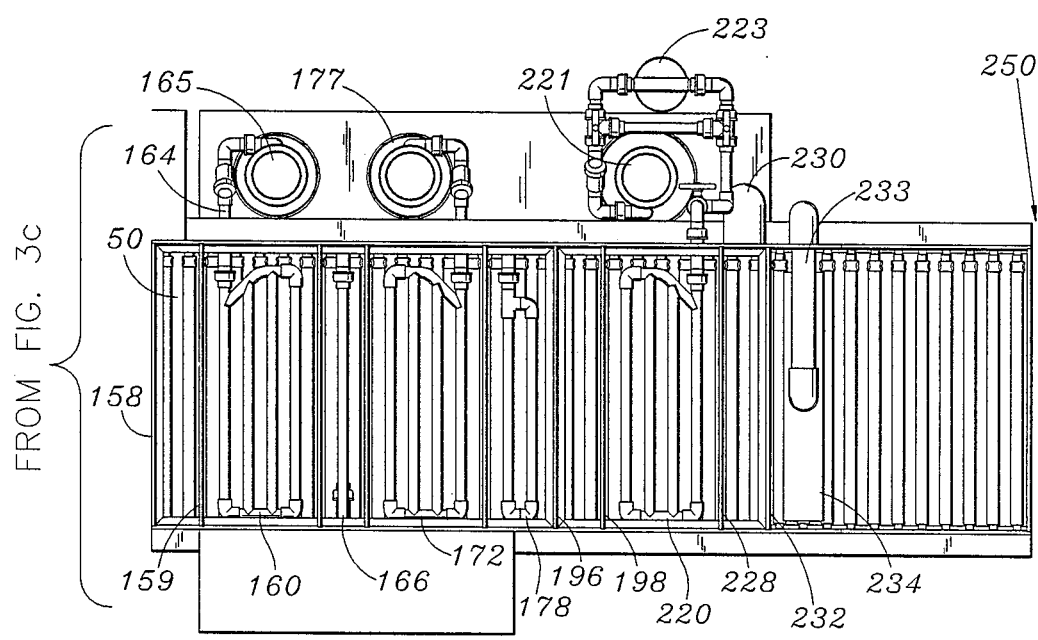
FIG. 3d is a fourth portion of a top view of a preferred conveyorized processing line in accordance with the present invention, wherein the top covers of various enclosures have been removed so as to expose the interior elements thereof.

Specifically, as shown in FIG. 2d, spray manifolds 160 and 162 are connected to water feedline 164. High pressure manifolds 166 and 168 are connected to high pressure feedline 170. Spray manifolds 172 and 174 are connected to water feedline 176 and fresh water manifolds 178 and 180 are connected to fresh water feedline 182.

Feedline 164 is connected to sump 184 while feedline 176 is connected to sump 186. Fresh water is sprayed through manifolds 178 and 180. Runoff from manifolds 178 and 180 is collected in sump 186. Water collected in sump 186 is then pumped through line 176 by pump 177 and sprayed through manifolds 172 and 174. The runoff from manifolds 172 and 174 is recollected in sump 186. Sump 186 is arranged so as to cascade over into sump 184 thus, excess recycled rinse water from sump 186 will continually pass into sump 184. The recycled water contained in sump 184 is pumpws through feedline 164 by by pump 165, thereby pressurizing manifolds 160 and 162. Runoff from the spray created by manifolds 160 and 162 is again collected and reclaimed in sump 184. In addition, a small amount (about 0.7 gal./min.) of fresh water is sprayed through manifolds 166 and 168 via high pressure pumps 194 and 200. Runoff from manifolds 166 and 168 is also collected in sump 184. Excess water collection in sump 184 is permitted to overflow through a drain.

The high pressure pumps 194 and 200 are of the centrifugal type while the motors 200 and 204 are totally enclosed fan cooled electric motors. Fresh water enters the input ports 210 and 212 of pumps 194 and 200 respectively via fresh water supply line 214. The high pressure (e.g. 100–250 psi) output of pumps 194 and 200 will pass through lines 191 and 193 thereby providing a high pressure water supply to spray manifolds 166 and 168.

By this novel arrangement of pumps, sumps, lines and spray manifolds, this preferred device of the invention effects a four (4) stage rinse as follows:

Stage 1: Recirculated water sprayed over a region of approximately 12 inches in length at a pressure of about 26 psi. Thus, inner layers passing along the conveyor at a rate of 4 ft/min. will be exposed to this first stage spray rinse for about 15 seconds.

Stage 2: Fresh water sprayed over a region of approximately 4–8 inches in length at a pressure between 100–250 psi (preferably 100 psi). Thus, as the inner layers pass along the conveyor 50 at a rate of 4 ft/min. they will be exposed to this second stage high pressure rinse for a period of 5–10 seconds.

Stage 3: Recirculated water sprayed over a region of approximately 12 inches in length at a pressure of about 26 psi. Thus, as the inner layers pass along the conveyor 50 at a rate of 4 ft/min. they will be exposed to this third stage spray rinse for a period of about 15 seconds.

Stage 4: Fresh water sprayed over a region of approximately 4–8 inches in length at a pressure of about 40 psi (standard line pressure). Thus, as the inner layers advance along the conveyor 50 at a rate of 4 ft/min. they will be exposed to this fourth stage fresh water spray rinse for a period of 5–10 seconds.

The individual stages of the multi-stage fresh water rinse are separated from one another by way of partitions 190, 192 and 194. Thus, carryover water from one stage to the other is minimized.

After the inner layers have passed through the complete multi-stage rinse system, they will continue to advance along conveyor 50, passing through openings in partitions 196 and 198. Thereafter, the inner layers are subjected to a post-treatment solution spray emanating from manifolds 220 and 222. The post-treatment spray manifolds 220 and 222 are fluidly connected to sump 224 and pump 221 is used to continually recirculate post-treatment solution from sump 124 through spray manifolds 220 and 222. Sump 224 is sized/configured to hold approximately 60–80 gallons and preferably about 70 gallons treatment solution when filled to capacity. A filter 223 is provided. Runoff post-treatment solution is collected in sump 224, thereby providing for a fully recirculating continuous spray process.

The spray pattern provided by manifolds 220 and 222 is sized so as to cover a region of approximately 12 inches in length and to deliver approximately 50 liters/min. of post-treatment solution. Thus, as the inner layers advance along conveyor 50 at a rate of 4 ft/min. they will be exposed to such post-treatment solution spray for a period of approximately 15 seconds.

Following exposure to the post treatment solution spray, the circuit board inner layers will pass through an opening in partition 228, thereby moving into an evaporation chamber defined by partitions 228 and 232. An exhaust duct 230 is positioned between partitions 228 and 232 so as to maintain some negative pressure within the evaporation chamber. The negative pressure created by exhaust duct 230 will cause air to be pulled through the conveyor-accomodating openings in partitions 228 and 232. As a result, forced heated air from hot air ducts 234 and 236 will readily pass through the opening in partition 232 and will strike the surfaces of the inner layers as they advance along the conveyor 50.

The four conveyor rollers (two sets) 231 positioned between partitions 228 and 232 are of a specialized nature and are preferably constructed of stainless steel shafts having a chamois-like silicone-free natural fiber covering. Rubber clad stainless steel rollers may also be employed, however the above-described chamois-like silicone-free natural fiber material is preferable. These specialized rollers 231 are positioned so as to evenly distribute and remove any excess of post treatment solution from the surfaces of the inner layers as they pass therebetween. After the inner layers have passed between specialized rollers 231 and 233 there will remain a thin, even and uniform layer of post treatment solution deposited on the surfaces thereof. The negative pressure created by exhaust duct 230 and the resultant flow of hot air through opening in partition 230 will serve to rapidly evaporate the solvents and/or other liquid from the layers of post treatment solution which remains on the surfaces of the inner layers.

Thereafter, the inner layers will continue to advance along conveyor 50 and will pass through the opening in partition 232. Hot air from hot air ducts 234 and 236 will then contact the surfaces of the advancing inner layers and effect further curing of the reactive post treatment solution as the silane coupling agent contained therein binds and/or otherwise reacts with the tin atoms plated on the surfaces of the advancing inner layers.

After passing between hot air ducts 234 and 236 the advancing inner layers will continue along conveyor 50 to the end 250 of the device where they may be collected and/or subjected to subsequent handling and/or assembly.

Although the invention has been described with reference to a presently preferred embodiment, it must be appreciated that various additions, modifications and alterations may be made without departing from the spirit and scope of the invention. For example, it is foreseeable that chemical treatment systems other than the DuraBond ™ system will be developed in the future and, accordingly, the present invention may be modified as necessary to employ newly developed or different chemical treatment solutions while continuing to optimize the efficiency of the operation, avoid waste of chemicals and minimize down time. Also, the processing line may be conveniently housed in four, rather than three major enclosures such that the evaporator and hot air curing section of the line is housed in a separate fourth enclosure—thereby being detachable/interchangeable as a separate component of the overall processing time. Accordingly, it is intended that all such additions, modifications and alterations be included within the scope of the following claims and the equivalents thereof.

What is claimed is:

1. A device for sequentially applying chemical treatment solutions to copper surfaces of circuit board inner layers, said device comprising:
    (a) a first sprayer apparatus for spray applying an alkaline cleaner solution onto the copper surfaces of the inner layers;
    (b) a second sprayer apparatus for rinsing the alkaline cleaner solution from the copper surfaces of the inner layers;
    (c) a third sprayer apparatus for spray applying an etching solution onto the copper surfaces of the inner layers;
    (d) a fourth sprayer apparatus for rinsing the etching solution from the copper surfaces of the inner layers;
    (e) a fifth sprayer apparatus for spraying an immersion tin solution onto the previously etched copper surfaces of the inner layers;
    (f) a sixth/multistage sprayer apparatus for thoroughly rinsing the immersion tin solution from the copper surfaces of the inner layers by way of a multistage water rinse including at least one stage comprising a high pressure water spray at a pressure above approximately 100 psi;
    (g) a seventh sprayer apparatus for spraying a post-treatment solution onto the copper surfaces of the inner layers, said post-treatment solution being operative to subsequently promote bonding between adhesive and said copper surfaces; and
    (h) a leveling apparatus for removing excess post-treatment solution and for leveling said post-treatment solution upon the surfaces of the inner layers.

2. The device of claim 1 further comprising (i) an apparatus for heating the surface of said circuit board inner layers to a temperature at which curing of the post-treatment solution will be effected.

3. The device of claim 1 wherein said alkaline cleaner solution, said etching solution, the immersion tin solution, the post-treatment solution, and all rinsing solutions are sequentially applied to the circuit board inner layers by way of a conveyorized process, comprising:
    (a) a conveyor operative to move the circuit board inner layers along a fixed conveyor path;
    (b) sprayers for sequentially spraying the alkaline cleaner solution, etching solution, immersion tin solution, post-treatment solution, and rinse solution onto the inner layers as they pass along the conveyor path such that each inner layer will be exposed to each of the said solutions for prescribed periods of time;
    (c) at least one sump positioned below the conveyor path and operative to collect runoff of at least one of the said sprayed solutions;
    (d) at least one pump and an attendant arrangement of piping for transferring solutions collected in said at least one sump and respraying such solutions upon additional inner layers as they pass along the conveyor path.

4. A device comprising:
    (a) a mechanical conveyor operative to move circuit board inner layers along a fixed path;
    (b) a first spray apparatus for spraying an alkaline cleaner solution over a first region of said conveyor so as to come in contact with said circuit board inner layers as they move along the path of said conveyor;
    (c) a second spray apparatus for spraying water over a second region of said conveyor so as to come in contact with said circuit board inner layers as they move along the path of said conveyor;
    (d) a third spraying apparatus for spraying an etching solution over a third region of said conveyor so as to come in contact with said circuit board inner layers as they move along the path of said conveyor;
    (e) a fourth spraying apparatus for spraying water over a fourth region of said conveyor so as to come in contact with said circuit board inner layers as they move along the path of said conveyor;
    (f) a fifth spraying apparatus for spraying solution over a fifth region of said conveyor so as to come in contact with said circuit board inner layers as they move along the path of said conveyor;
    (g) a sixth means for spraying apparatus for spraying a first stage spray rinse at approximately 25 psi over a sixth region of said conveyor so as to come in contact with said circuit board inner layers as they move along the path of said conveyor;
    (h) a seventh spraying apparatus for spraying a second stage high pressure spray rinse at 100-250 psi over a seventh region of said conveyor so as to come in contact with said circuit board inner layers as they move along the path of said conveyor;
    (i) an eighth spraying apparatus for spraying a third stage spray rinser at approximately 25 psi over an eighth region of said conveyor so as to come in contact with said circuit board inner layers as they move along the path of said conveyor;
    (j) a ninth spraying apparatus for spraying a fourth stage fresh water spray rinse over a ninth region of said conveyor so as to come in contact with said circuit board inner layers as they move along the path of said conveyor;
    (k) a tenth spraying apparatus for spraying over a tenth region of said conveyor so as to come in contact with said circuit board inner layers as they move along the path of said conveyor; and
    (l) an apparatus for removing excess post-treatment solution and for leveling the post-treatment solution upon the surfaces of the inner layers.

5. The device of claim 4 further comprising:
    (m) an apparatus for curing the post-treatment solution upon the surfaces of the inner layers.

6. The device of claim 4 further comprising an apparatus for maintaining the temperature of the immersion tin solution within the range of approximately 70-80 degrees fahrenheit.

7. The device of claim 4 further comprising an apparatus for maintaining the immersion tin solution at a temperature of approximately 72 degrees fahrenheit.

8. The device of claim 4 further comprising an apparatus for maintaining the temperature of the post-treatment solution within the range of approximately 70-80 degrees fahrenheit.

9. The device of claim 4 further comprising an apparatus for maintaining the temperature of the post-treatment solution at approximately 72 degrees fahrenheit.

10. The device of claim 4 wherein the said "apparatus for removing excess post-treatment solution and for leveling the post-treatment solution upon the surfaces of the inner layers" comprises a plurality of rollers operative to remove excess post-treatment solution from the surfaces of the inner layers and to insure even and uniform distribution of the remaining post-treatment solution thereupon.

11. The device of claim 4 wherein said plurality of rollers comprise rigid roller cones with silicone-free natural fiber coverings operative to effect removal of excess post-treatment solution and to insure that the post-treatment solution layer remaining on the surfaces of the inner layers is even and uniform.

12. The device of claim 4 wherein said first region is approximately 24 inches in length so that circuit board inner layers passing along the conveyor at a rate of four feet per minute will be exposed to the alkaline cleaner solution spray for approximately 30 seconds each.

13. The device of claim 4 wherein said second region is approximately 16-20 inches in length such that inner layers advancing along the conveyor at a rate of four feet per minute will be exposed to the water spray for approximately 20-30 seconds.

14. The device of claim 4 wherein said third region is approximately 48 inches in length such that inner layers advancing along the conveyor at a rate of four feet per minute will be exposed to the etching solution spray for a total of approximately 60 seconds.

15. The device of claim 4 wherein said fourth region is approximately 16-20 inches in length such that inner layers advancing along the conveyor at a rate of four feet per minute will be exposed to the water spray for a period of approximately 20-30 seconds.

16. The device of claim 4 wherein said fifth region is approximately 12 inches in length such that inner layers advancing along the conveyor will be exposed to the immersion tin solution spray for a period of approximately 60 seconds.

17. The device of claim 4 wherein said sixth region is approximately 12 inches in length such that inner layers passing along the conveyor at a rate of 4 ft/min will be exposed to the first stage spray rinse for a period of about 15 seconds.

18. The device of claim 4 wherein said seventh region is approximately 4-8 inches in length such that inner layers passing along the conveyor at a rate of four feet per minute will be exposed to the second stage high pressure rinse for a period of about 5-10 seconds.

19. The device of claim 4 wherein said eighth region is approximately 12 inches in length such that inner layers passing along the conveyor at a rate of four feet per minute will be exposed to the third stage spray rinse for a period of about 15 seconds.

20. The device of claim 4 wherein said ninth region is approximately 4-8 inches in length such that inner layers passing along the conveyor at a rate of four feet per minute will be exposed to the fourth stage fresh water spray rinse for a period of about 5-10 seconds.

21. The device of claim 4 wherein said tenth region is approximately 12 inches in length such that inner layers passing along the conveyor at a rate of four feet per minute will be exposed to the post-treatment solution spray for a period of approximately 15 seconds.

* * * * *

UNITED STATES PATENT AND TRADEMARK OFFICE
CERTIFICATE OF CORRECTION

PATENT NO. : 4,895,099

DATED : January 23, 1990

INVENTOR(S) : Mark D'Amato

It is certified that error appears in the above-identified patent and that said Letters Patent is hereby corrected as shown below:

Column 7, Line 61, change "55" to --75--

Column 7, Line 63, change "55" to --75--

Column 7, Line 64-66, change "(preferably two (2) sumps of about 80 gal. each)" to --a common sump of approximately 160 gals.--

Column 7, Line 65, change "180-220 gal." to --90-110 gal--

Column 7, Line 66-67, change "two (2) sumps of about 95 gal. each)" to --one (1) sump of approximately 95 gal.--

Column 7, Line 68, change "60-80" to --55--

Column 8, Line 4, change "70" to --55--

Column 8, Line 42, change "55" to --75--

Column 9, Line 25, after the first occurrence of "98" add --and 104--, and after the second occurrence of "98" add --and 104 are-- and delete "is"

Column 9, Line 31, after "98" add --and 104--

Column 9, Line 32, after "95" add --and 101--

Column 9, Line 36, after "98" add --and 104--

Column 10, Line 27, delete "two" and insert --a--

Column 10, Line 27, delete "sumps" and insert --sump--

UNITED STATES PATENT AND TRADEMARK OFFICE
CERTIFICATE OF CORRECTION

PATENT NO. : 4,895,099

DATED : January 23, 1990

INVENTOR(S) : Mark D'Amato

It is certified that error appears in the above-identified patent and that said Letters Patent is hereby corrected as shown below:

Column 10, Lines 28-29, delete "Each of these sumps" and insert therefore --This sump--

Column 10, Line 33, delete "180-220" and insert therefore --90-110--

Column 10, Line 34, delete "190" and insert therefore --95--

Column 10, Line 35, delete "both sumps" and insert therefore --the sump--

Column 10, Line 36, delete "are" and insert therefore --is--

Column 12, Line 8, delete "60-80" and insert therefore --40-60--

Column 12, Line 9, delete "70" and insert therefore --55--

Signed and Sealed this

Nineteenth Day of November, 1991

Attest:

HARRY F. MANBECK, JR.

*Attesting Officer*      *Commissioner of Patents and Trademarks*